United States Patent [19]

Bass

[11] Patent Number: 5,121,049

[45] Date of Patent: Jun. 9, 1992

[54] VOLTAGE REFERENCE HAVING STEEP TEMPERATURE COEFFICIENT AND METHOD OF OPERATION

[75] Inventor: Alan S. Bass, Plano, Tex.

[73] Assignee: Texas Instruments Incorporated, Dallas, Tex.

[21] Appl. No.: 502,376

[22] Filed: Mar. 30, 1990

[51] Int. Cl.$^5$ .............................................. G05F 3/16
[52] U.S. Cl. ..................................... 323/313; 323/907
[58] Field of Search ............... 323/312, 313, 314, 315, 323/316, 317, 354, 907; 307/310, 313, 314

[56] References Cited

U.S. PATENT DOCUMENTS

| | | | |
|---|---|---|---|
| 4,037,120 | 7/1977 | Colardelle et al. | 323/315 |
| 4,396,883 | 8/1983 | Holloway et al. | 323/313 |
| 4,443,753 | 4/1984 | McGlinchey | 323/313 |
| 4,460,865 | 7/1984 | Bynum et al. | 323/313 |
| 4,472,675 | 9/1984 | Shinomiya | 323/314 |
| 4,473,793 | 9/1984 | Blackmer et al. | 323/907 |
| 4,644,249 | 2/1987 | Chang | 323/313 |
| 4,714,872 | 12/1987 | Traa | 323/907 |
| 4,792,748 | 12/1988 | Thomas et al. | 323/315 |
| 5,049,806 | 9/1991 | Urakawa et al. | 323/907 |

Primary Examiner—Steven L. Stephan
Assistant Examiner—Jeffrey Sterrett
Attorney, Agent, or Firm—Gary C. Honeycutt; Richard Donaldson; William E. Hiller

[57] ABSTRACT

There is disclosed a temperature compensated reference voltage generation circuit and method adapted to maintain a specific temperature/voltage relationship. The circuit is designed such that it can easily be adapted to switch between different voltage temperature requirements simply by adjusting the parameters of a few circuit elements. The circuit relies upon three different current generators, each performing a different function.

5 Claims, 3 Drawing Sheets

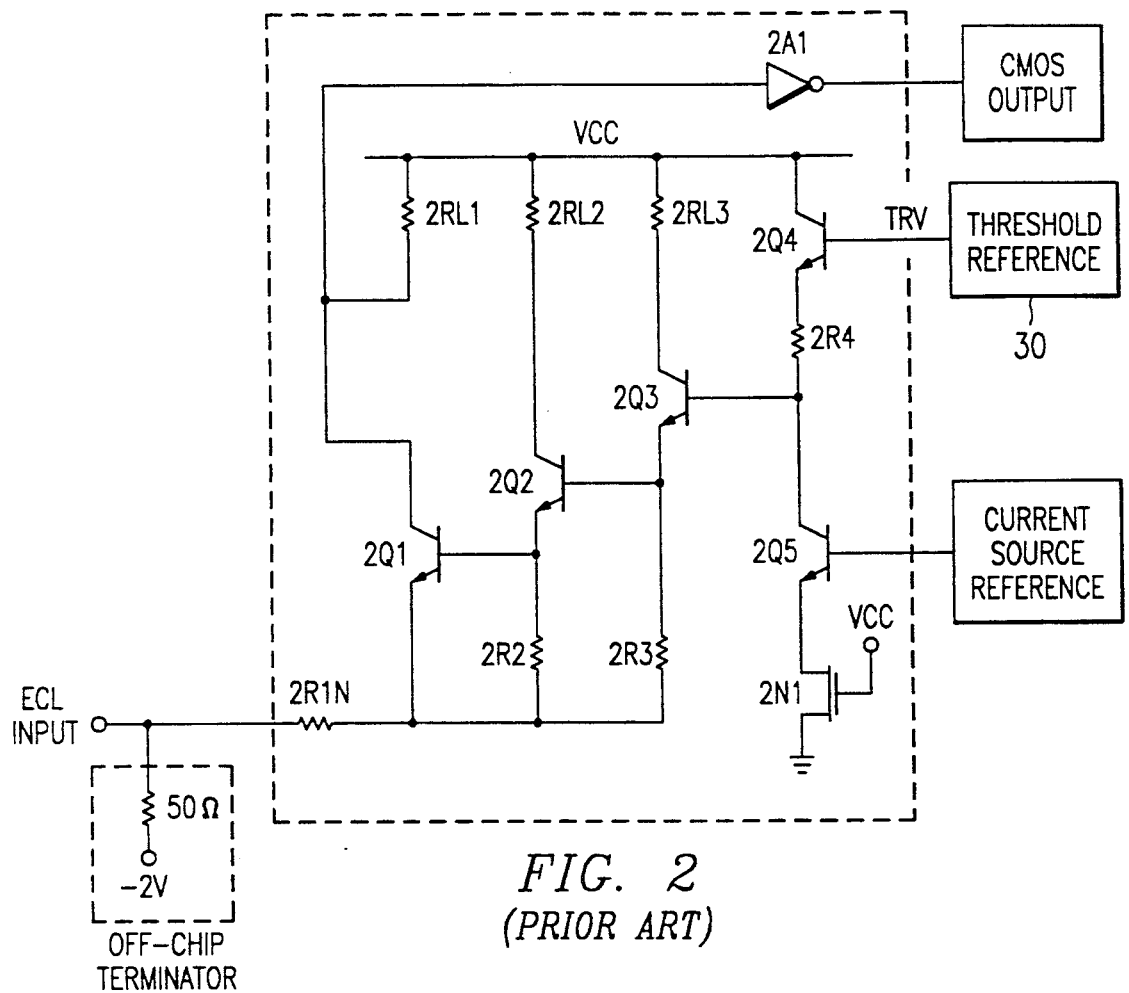
FIG. 2
(PRIOR ART)
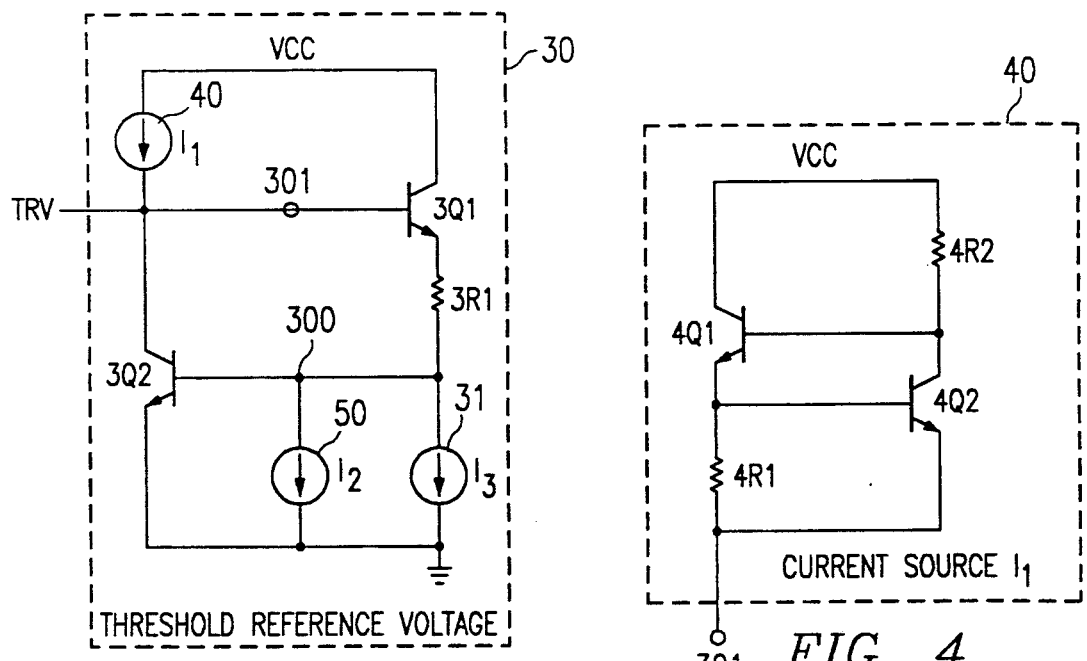
FIG. 3
FIG. 4

VOLTAGE REFERENCE HAVING STEEP TEMPERATURE COEFFICIENT AND METHOD OF OPERATION

TECHNICAL FIELD OF THE INVENTION

This invention relates generally to voltage reference circuits and methods of operation and more particularly to such circuits having steep temperature coefficients.

RELATED APPLICATIONS

All of the following patent applications are cross-referenced to one another, and all have been assigned to Texas Instruments Incorporated. These applications have been concurrently filed and are hereby incorporated in this patent application by reference.
Positive to Negative Voltage Translator Circuit and Method of Operation
Voltage Generator Having Steep Temperature Coefficient and Method of Operation
Voltage Reference Having Steep Temperature Coefficient and Method of Operation
Translator Circuit and Method of Operation
Voltage Stabilization Circuit and Method of Operation

BACKGROUND OF THE INVENTION

There are many circuits, particularly voltage level detector circuits, which must discriminate between two voltage levels. A common element of these circuits is that a reference voltage level must be established around which the level detection is founded.

Problems exist, however, when it is understood that the voltage level must be stabilized for temperature changes. Many standard circuits are now available which provide for very stable voltages over wide temperature swings. The problem is that some detector circuits themselves change their internal parameters dependant upon temperature. Thus, in these situations, the reference voltage must also change with respect to temperature to compensate.

A further problem exists in that in some situations, such as a ECL to CMOS logic level conversion circuit, there are different standards to which the reference voltage must be keyed. One of these standards requires the reference voltage to change with temperature while the other standard requires a reference voltage which is constant with respect to temperature changes. It is important to have a reference voltage which is easily converted from one standard to the other with a minimum of difficulty.

This problem is compounded in that, as discussed above, a constant reference voltage can not be used in any event due to changes in the converter circuit.

Thus, a need exists in the art for a voltage reference circuit which changes reference levels based upon temperature gradients with the rate of change very precisely controlled and matched to a given set of circuit components.

A further need exists in the art for such a circuit which can easily be adjusted to have different temperature coefficients to meet different standards.

The reason we needed this voltage reference generator was to drive the ECL to CMOS translator we had designed. We wanted that ECL to CMOS translator to be able to have thresholds, either a standard 100K threshold or a standard 10KH threshold. There are traditionally ECL circuits with these thresholds, and they have reference generators that are well known to produce voltages that allow those circuits to have the standard thresholds. However, because of the nature of this circuit, the threshold reference had to have a much different characteristic in order to get the ECL threshold, and it turned out it had to have some fairly steep temperature coefficients, in other words, the threshold reference had to change significantly as temperature changed in order for example to get the proper thresholds. For example, 100K threshold is −1.32 volts and does not change with temperature or voltage. However, in order to make our ECL to CMOS translator have a threshold that did not change over temperature, this reference voltage actually did have to change over temperature to compensate for other effects in the ECL to CMOS translator. Backing up for a moment, a conventional ECL circuit with 100K threshold has a reference center area that produces a voltage of −1.32 volts, and that voltage does not change over temperature, and it turns out that is the threshold of the circuit. Our ECL to CMOS translator also must have a threshold of −1.32 volts for 100K that does not change over temperature. However, because of the nature of the translator, we cannot feed in a voltage of −1.32 volts. The translator itself affects the threshold, and we have to feed in a different voltage that changes with temperature in order to make the threshold of the circuit be −1.32 volts. The 10KH threshold is also a standard. It is approximately −1.29 volts at room temperature, and its threshold does change as temperature changes. However, the threshold coming into the translator circuit has to change even more significantly in order to have the threshold of the circuit change as 10KH circuits change. There are voltage regulators known as band gap regulators that have been published and are of widespread knowledge of at least 20 years. These type circuits can produce a 10KH or 100K threshold, and there are many papers published on doing exactly that. However, the problem we have here is to produce a voltage with a much different temperature coefficient, and we have never seen anyone need a reference generator whose voltage varies significantly over temperature and at a given known rate. That was the purpose of this circuit.

SUMMARY OF THE INVENTION

By using a set of parallel current sources a voltage generator has been designed which allows for voltage changes as a function of temperature with the voltage slopes controlled in a very precise manner. In one situation, as the temperature rises the voltage decreases at a rate of 2 VBE's (with a VBE being defined as the voltage drop across a transistor base to emitter junction). In the other situation, the voltage decreases at the rate of almost 3 VBE's as the temperature increases.

One current source is designed to make the output reference voltage independent of supply voltage and dependant upon two BE junctions operating in conjunction with the voltage drop across a resistor. Thus, by controlling the voltage drop across the resistor we can control the rate at which the output reference changes with respect to temperature.

Two other current sources are designed to counterbalance each other for different temperature/voltage requirements. They can be used to generate either an output reference which is fixed regardless of temperature (except for the variation necessary to compensate for the external detector circuit) or an output voltage which varies with temperature.

One of the current sources is designed using, for example, a resistor with one VBE across it. The VBE decreases with increasing temperature and thus the current through the resistor decreases with temperature.

The second of the compensating pair of current sources is designed having transistors whose current density are adjusted to have an increased rate at which their VBE's shrink with increasing temperature. This, in effect, forces the current through their corresponding emitter resistors to increase with temperature.

By combining the two current sources and by adjusting them in a certain manner, two different reference voltages can be obtained, each with a distinctive temperature/voltage characteristic.

Accordingly, it is a technical advantage of this invention to provide a reference voltage source which is precisely defined with respect to variations as a function of temperature.

It is a further technical advantage of this invention to provide such a circuit having a pair of parallel current sources adjustable between them to effect different temperature/voltage characteristics to meet different standards.

It is a still further technical advantage of this invention to provide a reference voltage generator having steeply changing and yet precisely definable output voltages as a function of temperature while being able to easily change the defined characteristics.

It is a still further technical advantage of this invention to provide such a circuit having a low output impedance while still being immune to oscillations.

BRIEF DESCRIPTION OF THE DRAWINGS

The foregoing objects, features and technical advantages, as well as others, of the invention will be more apparent from the following description of the drawings in which:

FIG. 2 shows a prior art version of the conversion circuit;

FIG. 3 shows a schematic representation of the reference voltage circuit;

FIG. 4 shows one embodiment of one of the current sources;

DETAILED DESCRIPTION OF THE INVENTION

Figure 1:
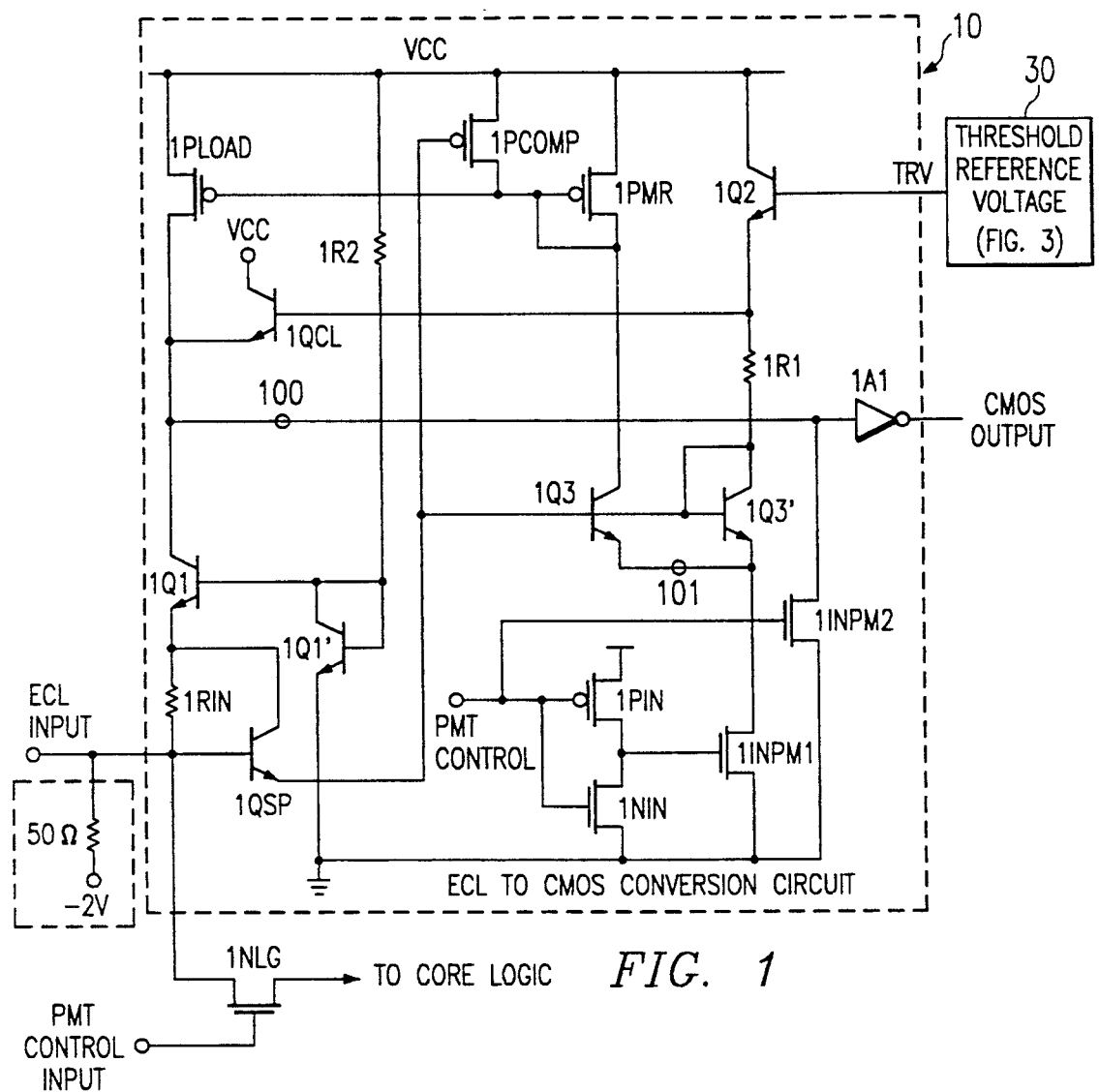
FIG. 1 shows a schematic diagram of the conversion circuit.

Turning now to FIG. 1, the signal from the ECL circuit (high to low or low to high) to the CMOS circuit is converted by circuit 10. The base of transistor 1QSP is tied to the ECL input and its emitter is tied to the base of bipolar transistors 1Q3 and 1Q3' essentially forming a capacitor between the input and the base of those bipolar transistors. The circuit operates such that when the input switches, a change in voltage occurs because of the capacitive coupling on the base of bipolar transistors 1Q3 and 1Q3' which, in turn, causes a large change in current to be pulled through those bipolar transistors. This in effect changes the voltage seen at the gate of P channel load transistor 1PLoad which makes the resistive characteristics of the P channel load change dramatically during switching.

Digressing momentarily, a P channel transistor, or any MOS transistor, has characteristics that when it is on, there is a small voltage between the source and drain, and it looks like a resistor. With slightly more voltage across the source and drain, the device behaves like a current source. The current level that can be maintained through a device depends upon the voltage applied to its gate. Thus, changing the voltage on the gate changes the amount of current flowing through the transistor. So, for example, when we want node 100 at the collector of transistor 1Q1 to rise very quickly, we want to change the characteristics of the P channel load transistor 1PLoad such that it can supply a great deal more current to pull node 100 up during switching. Similarly, when we want node 100 to fall, to go into the negative direction, we want the characteristics of transistor 1PLoad to change so that it can supply less current, effectively appearing as a resistor so that node 100 will come low much more quickly. The use of this type of feedback path is important in making this circuit fast acting in both directions.

The feedback circuit consists of the bipolar transistor 1QSP with its base emitter capacitance feeding the base of bipolar transistor 1Q3 whose collector is tied to a P channel device 1PMR used for biasing the P channel load transistor 1PLoad.

Transistor 1PComp is a voltage compensation transistor. The reason for this transistor is that there is a mirror circuit consisting of P channel transistors 1PMR and 1PLoad. The purpose of the mirror circuit is that any current that is pulled through transistor 1PMR is mirrored in the current through transistor 1PLoad. However, problems exist because of the fact that these are not perfectly ideal devices and because of the fact that the power supply voltage VCC, which is nominally 5 volts, can vary from 5.5 volts down to 4.5 volts. Such a variation in voltage will cause a slight change in the current through transistor 1PLoad which is undesirable. Transistor 1PComp compensates for that effect. As the VCC voltage changes, the current being pulled through transistor 1PComp also changes, which has an effect on the voltage at the gate of transistor 1PLoad. By adjusting the sizes of these devices, we can cancel out the effect of the VCC supply variation. Thus, by proper sizing, the circuit will work so that the effects of any power supply variations are cancelled out.

Transistor 1PLoad is much bigger than transistor 1PComp. Transistor 1PComp does not draw a major amount of current in the circuit. However, it is enough to compensate for the slight changes in current caused by the changes in the VCC supply. The relative sizes are determined by computer modeling and simulation and are on the order of a 10 to 1 size between transistor 1PLoad and transistor 1PComp.

Transistor 1QCL is a bipolar transistor and is connected to node 100. Node 100, it will be recalled, goes low when the collector of transistor 1Q1 goes low. If this were to happen, transistor 1Q1 would saturate. However, node 100 is clamped to prevent the node from going so negative that transistor 1Q1 saturates. If transistor 1Q1 saturates, the performance of the circuit slows significantly.

The base of transistor 1QCL is tied to a voltage that is fixed by reference generator 30 so transistor 1QCL holds node 100 from going below a certain point, thereby preventing transistor 1Q1 from saturating. When node 100 comes high, transistor 1QCL is off and does not affect the circuit operation. The voltage at the emitter of transistor 1QCL is designed to come down to about ½ volt above ground. The base of transistor 1Q1 is set to be a VBE above ground. The base of transistor 1Q1 is tied to the collector and base of bipolar transistor 1Q1' and to resistor 1R2. Resistor 1R2 and transistor 1Q1' together set the voltage at the base of transistor 1Q1 to be one VBE above ground, which means that the emitter of transistor 1Q1 will be one VBE down from that point which will be at ground. Thus, the emitter of transistor 1Q1 is always at approximately ground with its base at one VBE above ground and its collector no more negative than about ½ volt above ground.

Threshold reference voltage 30 is needed because an input circuit must have a threshold at which the circuit switches. A voltage higher than the threshold will cause it to switch into one state, while a voltage lower than the threshold will cause it to switch into another state. As the input voltage varies, the voltage across resistor 1RIN also varies because the emitter of transistor 1Q1 is always at ground. Since one end of resistor 1RIN is always at ground, changing the voltage on the other end of the resistor (ECL input) changes the current through the resistor and this changes the current through transistor 1Q1.

The threshold point will be determined by the point at which the current through resistor 1R1N is enough to cause the voltage at the collector of transistor 1Q1 to change significantly which, in turn, depends upon the characteristics of transistor 1PLoad. The concept behind the threshold reference is that by controlling the voltage on the gate of transistor 1PLoad, we can control its characteristics and, therefore, control the threshold of the circuit. The current through transistor 1PLoad is mainly determined by the current through transistor 1PMR. The gate and drain of transistor 1PMR are tied to the collector of transistor 1Q3. That transistor's base is tied to the base and collector of transistor 1Q3'. The current through those two transistors is the same and is determined by the voltage across resistor 1R1. Since the emitters of transistors 1Q3 and 1Q3' are approximately at ground, these bases will be approximately one VBE above ground, or at about 0.75 volts. This value sets the voltage on one end of resistor 1R1. The voltage at the other end of resistor 1R1 is determined by the voltage at the emitter of transistor 1Q2, which, in turn, will be determined by the threshold reference voltage TRV. Thus, by changing the threshold reference voltage, the voltage across resistor 1R1 can be changed which changes the current through resistor 1R1, which, by means of the mirror circuit, sets the characteristics of transistor 1PLoad.

In this circuit, we also allow for something called parallel module test. What parallel module test does is to allow us to test a core function directly without coming through the conversion circuit. Since the core function is at CMOS levels, we must apply a CMOS voltage level to the input which is normally meant to receive an ECL level. In normal operation, applying a CMOS level to the ECL input could damage the circuit. However, enabling the PMT control load effectively shuts off certain devices in the circuit so that we can route the input signal directly to the CMOS circuitry.

The PMT control input goes to a P channel device 1PIN and to an N channel device 1NIN which is an invertor circuit. The output of that invertor feeds N channel transistor 1NPM1. Essentially, when we go into the parallel module test mode, we turn off N channel transistor 1NPM1 which allows the node 101 at the emitter of transistors 1Q3 and 1Q3' to float. This allows us to take the input all the way to CMOS levels without clamping them or damaging the circuit. Damage occurs because in normal operation, transistor 1NPM1 is on and represents a very small resistance so that the emitters of transistors of 1Q3 and 1Q3' are almost at ground. There are two base emitter junctions from the ECL input to node 101 and this means the input cannot rise more than the voltage across two base emitter junctions. Typically, this would be about 1.5 volts. If the input is forced higher, extremely large currents would be pulled into the circuit, possibly causing damage. Turning off transistor 1NPM1 eliminates that problem.

In normal operation, N channel transistor 1NPM2 is off and does not affect the operation of the circuit. When the circuit is placed in the parallel module test mode, the output of this circuit would be floating and this could float to one state or the other which is undesirable for some of the tests that are performed. N channel transistor 1NPM2 is turned on when we are in the parallel module test mode and node 100 is pulled to ground. Accordingly, the output of the conversion circuit, via amplifier 1A1 is forced high during the test mode.

During parallel module test (PMT) we are not using the translator, but rather going around it. However, the output of the translator still does feed core logic, which if fed by a level that was floating, could cause the core CMOS logic to dissipate DC power when it should not be dissipating power.

For PMT control, transistor 1NLG is turned on, the idea being that when the PMT control input signal goes high, transistor 1NLG turns on and allows a signal from the ECL pin to go directly into the CMOS core for testing core functions.

In order to solve the speed problem, several major changes were made to the prior art circuit, as shown in FIG. 2. To begin with, in the improved circuit the control transistor (1Q1) is biased so that it is always turned on, which eliminate switching time. Next, a P channel transistor (1PLoad) is connected to the collector of the control transistor (1Q1) and acts as a load for the control transistor. In the prior art circuit of FIG. 2, transistor 2Q1 actually switches on and off.

Another major improvement is that transistor 1Q1 (FIG. 1) is connected to a P channel transistor used as a load to achieve a characteristic such that the switching point at the collector transistor of 1Q1 switches much more quickly and suddenly than if just a resistor were used. Also, by using the P channel load transistor, we can employ a path back through the circuit where the resistive characteristics of that P channel transistor actually change during switching, further speeding up the circuit. This is accomplished by the use of the transistor acting as a speed up capacitor.

The circuit of FIG. 1 uses current mirrors to further speed up the switching of the P channel transistor. A voltage regulator is used to maintain a very stable switching point for the P channel device. A current drain is also used to insure that the control transistor is stable over a variation of voltage. A threshold voltage reference level is provided which is temperature compensated and which controls the on-off detection.

THRESHOLD REFERENCE VOLTAGE

Threshold reference voltage circuit 30 is shown in FIG. 3. The voltage reference TRV is a certain voltage up from ground. There is a base to emitter voltage (VBE) across transistor 3Q2 so the base of 3Q2 is a VBE up from ground. There will be some voltage across resistors 3R1 and there is another VBE across transistor 3Q1 and that voltage is the reference voltage TRV. Essentially then, reference voltage TRV is up two VBE's plus the voltage across resistor 3R1 from ground. In order to have the VBE across transistor 3Q2 remain constant and independent of voltage, a current source 40 is used to provide a current I1 into transistor 3Q2.

The VBE's of this circuit have certain temperature characteristics that are dependent upon the technology, and cannot easily be adjusted. However, it is critical to adjust the voltage across resistor 3R1 over temperature in order to obtain the temperature coefficient desired. This temperature coefficient, as we will see, is different for different types of circuits. The voltage across resistor 3R1 is, of course, set by the current being pulled through it. This current, in turn, is set by two different current sources 50 (I2) and 31 (I3). These sources have been constructed differently so that the current through one of the current sources will increase as temperature increases, while the current through the other current source will decrease as temperature increases. Then, by changing the magnitudes of I2 and I3 relative to each other, it is possible to obtain the exact characteristic of voltage change across resistor 3R1 with temperature desired.

FIG. 4 shows one embodiment of current source 40 (I1) which is basically a current source that must be independent of supply voltage VCC. This source is constructed using two bipolar transistors 4Q1 and 4Q2 and two resistors 4R1 and 4R2. Most of the current in circuit 40 flows through transistor 4Q1 and resistor 4R1. Only a small percentage of current flows through resistor 4R2 and transistor 4Q2. Resistor 4R2 is large with respect to resistor 4R1. The base emitter voltage across transistor 4Q2 sets the voltage across resistor 4R1, and therefore, sets the current dependent on the value of resistor 4R1.

As the voltage VCC applied to the circuit changes, the VBE of transistor 4Q2 does not change and thus the voltage across resistor 4R1 does not change. Accordingly, the current through resistor 4R1 which is also the current through transistor 4Q1 remains constant and independent of voltage supply. As the supply voltage VCC varies, the voltage across the resistor 4R2 will vary and thus the current through that resistor will vary. However, because resistor 4R2 is large and represents only a small percentage of the total current, circuit 40 (I1) comes very close to being independent of voltage.

Figure 5:
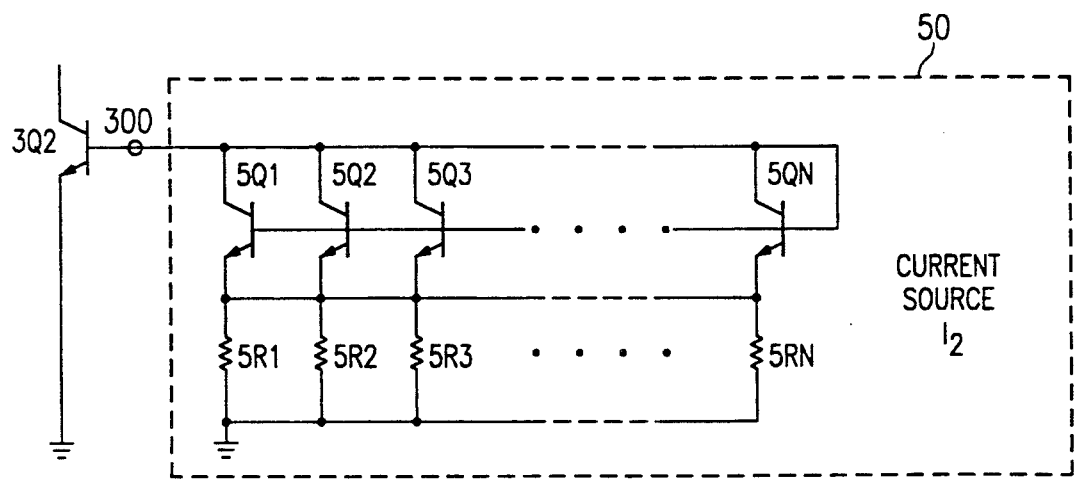
FIG. 5 shows an embodiment of a second one of the current sources.

FIG. 5 shows one embodiment of current source 50 (I2) which is connected between the base and emitter of transistor 3Q2 (FIG. 3). Current source 50 is established so that its current will increase as temperature increases. This is accomplished by taking advantage of the properties of bipolar transistors which are very stable and very predictable and operate such that the voltage across their base emitter junctions decreases as temperature increases. The rate of decrease is dependent on the current density in these transistors such that as the current density decreases, the rate at which the voltage decreases grows larger. Thus, for example, when the voltage across the base to emitter of transistor 3Q2 decreases as the temperature increases, the VBE voltage of all the bipolar transistors 5Q1 to 5QN in current source 50 also decreases. However, this circuit is set up so that the bipolar transistors in current source 50 have a much lower current density than the current flowing through transistor 3Q2.

Digressing momentarily, this can be accomplished in several ways. One method is by putting many transistors in parallel and making very large transistors. We tend to put many transistors in parallel so that all the transistors in the circuit can be exactly the same so that variations in layout and processing will affect them all in the exact same way.

Because the VBE's of the transistors in circuit 50 are shrinking more rapidly than the VBE of transistor 3Q2, it means that the total voltage across resistors 5R1 to 5RN in current source 50 increases as temperature increases. Since the voltage across these resistors increase, the current through them increases. Thus, with increasing temperature, current source 50 pulls more current.

Since the total voltage across current source 50 is basically the sum of the voltage across the base emitters of transistors 5Q1 to 5QN plus the voltage across resistors 5R1 to 5RN, it follows that the voltage across resistors 5R1 to 5RN must increase.

Figure 6:
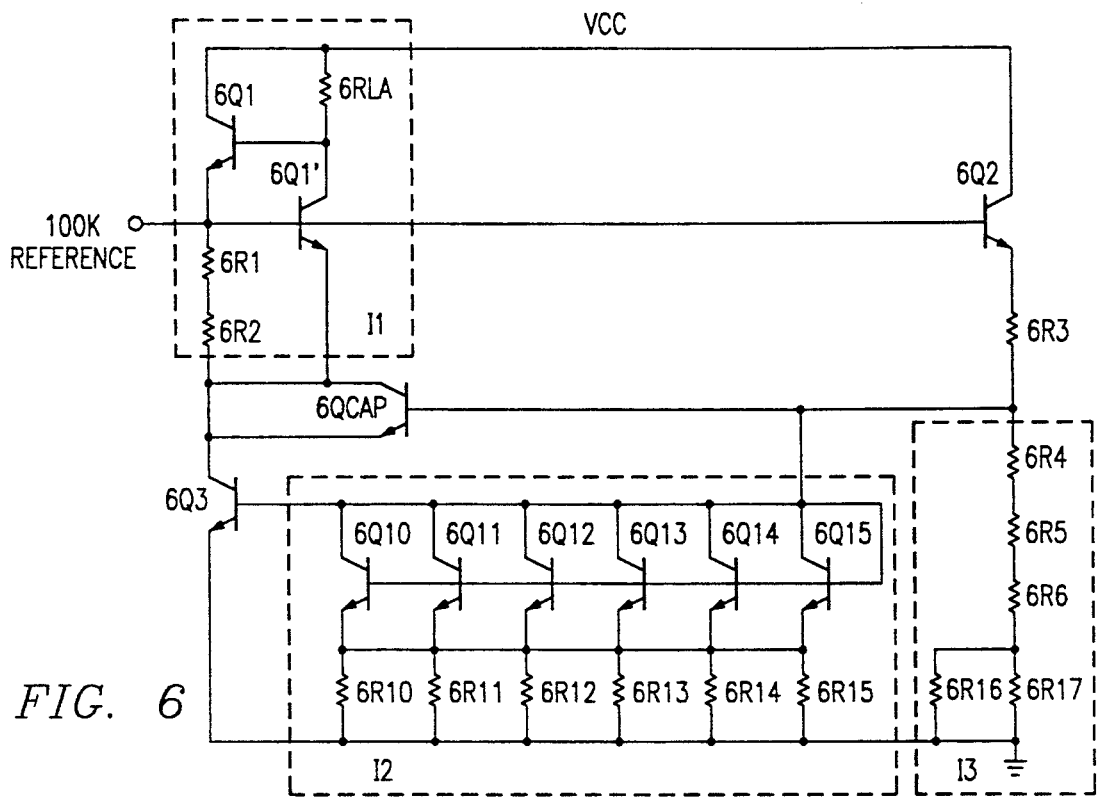
FIGS. 6 and 7 show embodiments of the special voltage circuit using different temperature/voltage coefficients.

Current source 31 (I3) is shown detailed in FIG. 6 and is very simply implemented as a resistor or series of resistors. This follows since the property of I3 is such that it should decrease as temperature increases. The voltage across circuit 31 is the voltage across the base emitter junction of transistor 3Q2, which is transistor 6Q3, in FIG. 6. That voltage will decrease with increasing temperature so if circuit 31 is a resistor, its current will decrease with increasing temperature.

By changing the magnitudes of I2 and I3, we can adjust the total amount of current to increase or decrease in any amounts we wish over temperature. These values can be changed remotely by adding appropriate transistor switches and access to control the switches, either on a permanent basis, as with toggle switches, or as with leads allowing remote programming.

Figure 7:
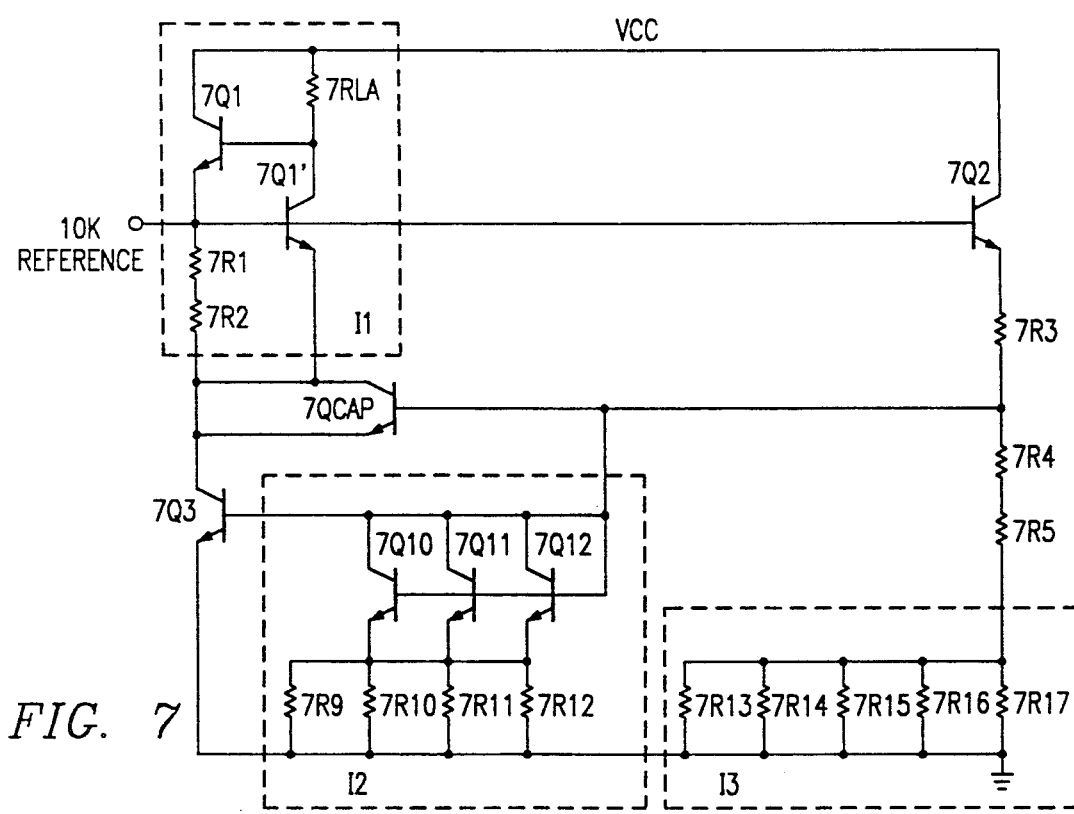

Specific examples are shown in FIGS. 6 and 7. For example, in the 100K bias generator shown in FIG. 6, the current source I2 consists of six bipolar transistors 6Q10-6Q15 and six resistors 6R10-6R15 in parallel. The I3 current source consists of two resistors 6R16-6R17 in parallel and in series with three resistors 6R4-6R6. Now the reason we use parallel series combinations of resistors and transistors is that when we lay them out, they are all identical. Thus, if the process varies, the ratios of resistances don't vary.

The 10KH reference circuit shown in FIG. 7 is set up with the same concept. It is set up so that the amount of current going through the I2 and I3 current sources has changed. In the 10KH reference, the I3 current source has less resistance so that it pulls more current. The I2 current source is pulling less current, which changes the temperature characteristic of the total current being pulled through the sum of I2 and I3, and that is what gives us the desired temperature characteristics at the output of the reference generators.

It turns out that in the case of the 100K generator (FIG. 6) the voltage across resistor 6R3 must be constant with temperature. That means reference voltage output will decrease with increasing temperature at the rate at which 2 VBE's decrease with temperature. These two VBE's decreasing with temperature are to compensate for two other VBE's in the actual ECL to CMOS translator (FIG. 1) which decrease with temperature. It turns out that keeping the voltage constant across 6R3 over temperature will enable translator 10 to maintain a constant threshold.

The 10KH reference must change with temperature so the voltage across 7R3 must change with temperature. Thus, in the case of the 100K circuit (FIG. 6) we are maintaining a constant voltage across resistor 6R3 over temperature while in the case of 10KH circuits in FIG. 7 we are not. So for the 100K case, the sum of I2 and I3 must give a current that is constant over temperature. In the 10KH case, that is not the case so we adjust the relative ratios of current being pulled through I2 and I3 so that the voltage across R1 does in fact change over temperature.

Although the present invention has been described with respect to a specific preferred embodiment thereof, various changes and modifications may be suggested by one skilled in the art, and it is intended that the present invention encompass such changes and modifications as fall within the scope of the appended claims.

Note that an extra transistor, 6QCAP (FIG. 6), or 7QCAP (FIG. 7) has been added to the generators. The generators have a feedback path which helps provide a low impedance output, but the feedback path can also cause the circuit to oscillate. The base-emitter, base-collector, and collector-substrate capacitances of 6QCAP or 7QCAP change the gain and phase shift characteristics of the generators so that they cannot oscillate. The use of device capacitances such as provided by 6QCAP or 7QCAP to prevent oscillations is a common, well-known practice used on circuits having feedback paths.

What is claimed is:

1. A reference voltage generation circuit having precisely controllable temperature/voltage characteristics, said circuit comprising
   an output for supplying said voltage,
   a first current source for supplying a current independent of supply voltage,
   a first circuit for supplying a constant voltage, said first circuit dependant upon current from said first current source,
   a second current source for supplying current which increases as temperature increases,
   a third current source for supplying current which decreases as temperature increases, and
   circuitry for mixing said second and third currents to produce a resulting voltage at said output having controllable voltage characteristics as a function of temperature.

2. The circuit set forth in claim 1 wherein said mixing circuit includes a resistive element.

3. The circuit set forth in claim 2 wherein said first current source includes
   a pair of transistors, the base of a first one of said transistors connected to the collector of the second one of said transistors, the collector of said first transistor connected to said supply voltage and the collector of said second transistor resistively connected to said supply voltage, said base of said second transistor connected to said emitter of said first transistor and also resistively connected to said output, and said emitter of said second transistor connected to said output.

4. The circuit set forth in claim 2 wherein said second current source includes
   a plurality of parallel connected transistors, each having their bases, collectors and emitters, respectively connected in common, and wherein the common emitters are resistively connected to ground.

5. The circuit set forth in claim 2 wherein said third current source includes at least one resistor, the value of which is variable depending upon the degree of change that is required and the magnitude of the desired output voltage level.

* * * * *